(12) United States Patent
Ma et al.

(10) Patent No.: US 11,398,817 B2
(45) Date of Patent: Jul. 26, 2022

(54) ON-LINE MONITORING SYSTEM FOR MEASURING ON-STATE VOLTAGE DROP OF POWER SEMICONDUCTOR DEVICES

(71) Applicant: SHANGHAI JIAO TONG UNIVERSITY, Shanghai (CN)

(72) Inventors: Ke Ma, Shanghai (CN); Ye Zhu, Shanghai (CN); Jiayang Lin, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 210 days.

(21) Appl. No.: 16/870,855

(22) Filed: May 8, 2020

(65) Prior Publication Data

US 2020/0366279 A1 Nov. 19, 2020

(30) Foreign Application Priority Data

May 13, 2019 (CN) .......................... 201910395515.9

(51) Int. Cl.
*H03K 17/082* (2006.01)
*G01R 31/26* (2020.01)
*H02H 3/20* (2006.01)

(52) U.S. Cl.
CPC ..... *H03K 17/0822* (2013.01); *G01R 31/2621* (2013.01); *H02H 3/207* (2013.01); *H03K 2217/0027* (2013.01)

(58) Field of Classification Search
CPC ........... H02M 1/00; H02M 3/00; H01L 21/00; H01L 22/00
See application file for complete search history.

(56) References Cited

U.S. PATENT DOCUMENTS

| 5,723,974 A | 3/1998 | Gray |
| 9,112,501 B2 | 8/2015 | Norling |
(Continued)

FOREIGN PATENT DOCUMENTS

| CN | 104181462 A | 7/2010 |
| CN | 105811765 A | 7/2016 |
(Continued)

*Primary Examiner* — Jermele M Hollington
*Assistant Examiner* — Temilade S Rhodes-Vivour
(74) *Attorney, Agent, or Firm* — True Shepherd LLC; Andrew C. Cheng (57) ABSTRACT

An online monitoring system for measuring the on-state voltage drop of power semiconductor devices comprises a voltage withstanding circuit and a voltage clamping circuit, one terminal of the voltage withstanding circuit is connected to one terminal of the voltage clamping circuit, and the other terminals of the voltage withstanding circuit and the voltage clamping circuit are randomly connected to two terminals of the power semiconductor device under test (DUT) respectively. The two terminals of the voltage clamping circuit are output terminals of the online monitoring system. A clamping voltage of the voltage clamping circuit is higher than the on-state voltage drop of the DUT. When the DUT is off, the output voltage of the system is fixed to the clamping voltage, and when it is on, the output voltage is not clamped. The system has simplified structure and enables convenient, accurate and low-cost measurement of on-state voltage drop.

18 Claims, 9 Drawing Sheets

(56) References Cited

U.S. PATENT DOCUMENTS

| | | | | |
|---|---|---|---|---|
| 10,084,448 B2* | 9/2018 | Godycki | .............. | H03K 17/063 |
| 2007/0159866 A1* | 7/2007 | Siri | ................... | H02M 7/53803 |
| | | | | 363/95 |
| 2010/0134941 A1* | 6/2010 | Nakahara | ........... | H03K 17/0822 |
| | | | | 361/91.1 |
| 2013/0049783 A1* | 2/2013 | Driesen | .............. | G01R 31/2621 |
| | | | | 327/309 |
| 2014/0016361 A1* | 1/2014 | Weis | ................... | H03K 17/102 |
| | | | | 363/21.02 |
| 2018/0181151 A1* | 6/2018 | Xu | ........................... | G05F 1/56 |

FOREIGN PATENT DOCUMENTS

| CN | 110174603 A | 8/2019 |
|---|---|---|
| JP | 2000105614 A | 4/2000 |

\* cited by examiner

ON-LINE MONITORING SYSTEM FOR MEASURING ON-STATE VOLTAGE DROP OF POWER SEMICONDUCTOR DEVICES

CROSS-REFERENCE TO RELATED APPLICATIONS

This application claims priority to Chinese Patent Application No. 201910395515.9 with a filing date of May 13, 2019. The content of the aforementioned application, including any intervening amendments thereto, is incorporated herein by reference.

TECHNICAL FIELD

The present disclosure relates generally to on-line monitoring of power semiconductor devices, and more particularly to an on-line monitoring system for the on-state voltage of power semiconductor devices.

BACKGROUND OF THE PRESENT INVENTION

Power semiconductor devices are crucial components of power electronic converters, and the fatigue of power semiconductor devices is the main cause of the failure of converters. On-state voltage drop is a significant parameter of power semiconductor devices, which is related to the junction temperature of power semiconductor devices. It could be used as a temperature sensitive electrical parameter (TSEP) to monitor the thermal condition of devices. Besides, on-state voltage drop is also a primary characteristic revealing the aging state of devices, because it varies if there is a crack or lift-off on the bond-wires inside the devices. To monitor the on-state voltage drop accurately, the resolution of monitoring system should be millivolts. If the on-state voltage is measured directly by a voltage probe, the high voltage across the devices at their turn-off state leads to the low resolution and poor precision. Therefore, it is necessary to introduce an on-line monitoring system, which can clamp the off-state voltage of power semiconductor devices at a low level in order to improve the on-line resolution.

SUMMARY OF PRESENT INVENTION

In general, the present disclosure aims at providing an on-line monitoring system for measuring an on-state voltage drop of a power semiconductor device with a simple structure and high resolution.

In one aspect, a system for on-line monitoring the on-state voltage drop of the power semiconductor device, comprises a voltage withstanding circuit and a voltage clamping circuit. One terminal of the voltage withstanding circuit is connected to one terminal of the voltage clamping circuit. The other terminal of the voltage withstanding circuit and the other terminal of the voltage clamping circuit are randomly connected to two terminals of the power semiconductor device under test respectively. The two terminals of the voltage clamping circuit are the output terminals of the on-line monitoring system. The clamping voltage of the voltage clamping circuit is higher than the on-state voltage drop of the power semiconductor device under test; when the power semiconductor device under test is off, the output voltage of the system is fixed to the clamping voltage, and when the power semiconductor device under test is on, the output voltage is not clamped.

When the device under test (DUT) is off, its voltage drop is called a first voltage and the output of the system is clamped to a second voltage by the voltage clamping circuit. The difference between those two voltages is withstood by the voltage withstanding circuit. The monitoring system automatically change the state of circuit based on the characterization of the components in the system, without any other drive signals. Therefore, the system could realize accurate and convenient measurement of the on-state voltage drop of DUT on-line with a simple structure.

In an implementation of the on-line monitoring system, the two terminals of DUT are terminal D and terminal S. One terminal of the voltage withstanding circuit is connected to the terminal D. The other terminal of the voltage withstanding circuit is connected to one terminal of the voltage clamping circuit. The other terminal of the voltage clamping circuit is connected to the terminal S. The two terminals of the voltage clamping circuit are the output terminals of the on-line system.

Implementations of the voltage withstanding circuit may comprise a first field-effect transistor (FET) and a resistor. The drain of the first FET is connected to the terminal D, and the two nodes of the resistor are connected to the gate and the source of the first FET respectively.

Implementations of the voltage clamping circuit may comprise a second FET. The gate and the drain of the second FET are connected to the gate of the first FET, the source of the second FET is connected to the terminal S. and the drain and the source of the second FET are the output terminals of the on-line monitoring system.

Implementations mentioned above are appropriate for a controllable DUT. When the DUT is on, the first FET is conductive with almost no current through it, so that there is hardly any voltage drop on the first FET and the resistor. The output voltage of the system is the on-state voltage drop of the DUT. Besides, when the DUT is off, the output voltage of the system is clamped to the gate threshold voltage of the second FET and the first FET is at saturated state to withstand the voltage difference between input and output of the system.

Other kinds of implementations of the voltage clamping circuit may comprise a diode. For one connection method, the anode of the diode is connected to the source of the second FET, the cathode of the diode is connected to the terminal S, the drain of the second FET and the cathode of the diode are the output terminals of the system. For another connection method, the anode of the diode is connected to the gate of the first FET, the cathode of the diode is connected to the drain and the gate of the second FET, the source of the second FET is connected to the terminal S, the anode of the diode and the source of the second FET are the output terminals of the on-line monitoring system.

Implementations including diodes are appropriate for the controllable DUT, an uncontrollable DUT and a combination of the controllable and uncontrollable DUTs. When the controllable DUT is on, the first FET is conductive with almost no current through it, so that there is hardly any voltage drop on the first FET and the resistor. The output voltage of the system is the on-state voltage drop of the DUT. When the uncontrollable DUT is forward biased, the first FET is conductive with almost no current through it, so that there is hardly any voltage drop on the first FET and the resistor. The output voltage of the system is the opposite value of the forward voltage drop of the DUT.

Implementations of the voltage clamping circuit may comprise a transistor. The gate and the collector of the transistor are connected to the gate of the first FET. The emitter of the transistor is connected to the terminal S. The collector and the emitter of the transistor are the output terminals of the on-line monitoring system. The transistor may be insulated-gate bipolar transistor (IGBT).

Implementations including a transistor are appropriate for the controllable DUT, the uncontrollable DUT and a combination of the controllable and uncontrollable DUTs. When the DUT is off, the input of the system is high voltage. The output voltage of the system is clamped to the gate threshold voltage of the transistor, and the first FET is at saturated state to withstand the difference voltage between input and output of the system. When the controllable DUT is on, the first FET is conductive with almost no current through it, so that there is hardly any voltage drop on the first FET and the resistor. The output voltage of the system is the on-state voltage drop of the DU. When the uncontrollable DUT is forward biased, the first FET is conductive with almost no current through it, so that there is hardly any voltage drop on the first FET and the resistor. The output voltage of the system is the opposite value of the forward voltage drop of the DUT.

In another implementation of the on-line monitoring system, the two terminals of the DUT are terminal D and terminal S. One terminal of the voltage withstanding circuit is connected to the terminal S. The other terminal of the voltage withstanding circuit is connected to one terminal of the voltage clamping circuit. The other terminal of the voltage clamping circuit is connected to the terminal D. The two terminals of the voltage clamping circuit are the output terminals of the on-line monitoring system. The electrical characterization of the implementation is similar with the explanation above.

Implementations of the voltage withstanding circuit may comprise a first FET and a resistor. The gate of the first ET is connected to the terminal S, and the two nodes of the resistor are connected to the gate and the source of the first FET respectively. The drain of the first FET is connected to one terminal of the voltage clamping circuit.

Implementations of the voltage clamping circuit may comprise a second FET. The gate and the drain of the second FET are connected to the terminal D, the source of the second FET is connected to the drain of the first FET, the drain and the source of the second FET are the output terminals of the on-line monitoring system.

Implementations of voltage clamping circuit may also comprise a diode. For one connection method, the anode of the diode is connected to the source of the second FET, the cathode of the diode is connected to the drain of the first FET, the drain of the second FET and the cathode of the diode are the output terminals of the on-line monitoring system. For another connection method, the anode of the diode is connected to the terminal D, the cathode of the diode is connected to the drain and the gate of the second FET, the anode of the diode and the source of the second FET are the output terminals of on-line monitoring system.

Implementations of the voltage clamping circuit may comprise a transistor. The gate and the collector of the transistor are connected to the terminal D. The emitter of the transistor is connected to the drain of the first FET. The collector and the emitter of the transistor are the output terminals of the on-line monitoring system. The transistor may be insulated-gate bipolar transistor (IGBT).

Implementations of the voltage withstanding circuit may comprise one or more voltage withstanding units and a current limiting circuit (CLC). The current limiting circuit is connected in series between two voltage withstanding units or between the voltage withstanding unit and the voltage clamping circuit.

Implementations of the voltage withstanding unit may comprise a first FET and a resistor. The drain of the first FET is one terminal of the voltage withstanding unit. The source of the first FET is connected to one node of the resistor. The gate of the first FET connected to the other node of the resistor is the other terminal of the voltage withstanding unit.

Implementations of the voltage withstanding unit may also comprise a voltage balancing resistor. The two nodes of the voltage balancing resistor are connected to the drain and the gate of the FET respectively.

Implementations of the current limiting circuit may comprise resistors or inductors or a series connection of resistors and inductors.

Implementations of the voltage clamping circuit may comprise a second FET or a transistor. The gate and the drain of the second FET connected together is the positive terminal of the voltage clamping circuit, the source of the second FET is the negative terminal of the voltage clamping circuit. Or the gate and the collector of the transistor connected together is the positive terminal of the voltage clamping circuit, the emitter of the transistor is the negative terminal of the voltage clamping circuit.

Implementations of the voltage clamping circuit may also comprise a diode. The cathode of the diode is connected to the gate and the drain of the second FET, the anode of diode is the positive terminal of the voltage clamping circuit; or the anode of the diode is connected to the source of the second FET, the cathode of diode is the negative terminal of the voltage clamping circuit.

Implementations of the voltage clamping circuit may also comprise a modulatory capacitor. The two nodes of the modulatory capacitor are respectively connected to the gate and the source of the second FET, or the gate and the emitter of the transistor.

In the other aspect, a system for on-line monitoring the on-state voltage drop of the power semiconductor device, comprises one or several implementations mentioned above.

Comparing to the prior art, the implementations in the present disclosure have more than one following advantages:

1. The system has a simple electrical structure without additional auxiliary powers or control signals;
2. The system has no voltage drop in the voltage withstanding circuit when the DUT is switched on, which makes the output voltage of the system more precise;
3. The system is appropriate for both controllable and uncontrollable DUTs, avoiding the dilemma of using different systems for different kinds of DUTs.

BRIEF DESCRIPTION OF DRAWINGS

The features, objectives and advantages of the disclosure will be more obvious to one of ordinary skill in the art with reference to the drawings and illustrative embodiments provided below.

DETAILED DESCRIPTION OF PREFERRED EMBODIMENTS

The disclosure is further described in detail below in combination with specific embodiments. The following embodiments are for the purpose of understanding the disclosure but do not limiting the disclosure in any form. It should be noted that various modifications and improvements may be made by those of ordinary skill in the art without departing from the concept of the disclosure. These modifications and improvements belong to the protection scope of the disclosure.

Figure 1:
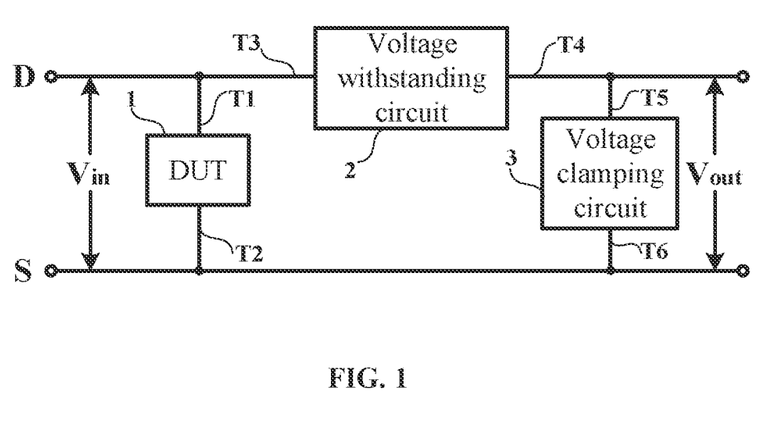
FIG. 1 shows an overall block diagram of an on-line monitoring system according to a first embodiment of the disclosure.

FIG. 1 shows an overall block diagram of an on-line monitoring system according to an embodiment of the disclosure. In FIG. 1, the on-line monitoring system comprises a voltage withstanding circuit 2 and a voltage clamping circuit 3. The two terminals of the DUT 1, that is terminal D T1 and terminal S T2, are the two input terminals of the on-line monitoring system. The terminal T3 and the terminal T4 are the two terminals of the voltage withstanding circuit 2. The terminal T5 and the terminal T6 are the two terminals of the voltage clamping circuit. The terminal T3 is connected to the terminal T1. The terminal T4 is connected to the terminal T5. The terminal T6 is connected to the terminal T2. The clamping voltage of the voltage clamping circuit 3 is higher than the on-state voltage drop of the DUT 1. The configurations of implementations showed in FIG. 3, FIG. 6, FIG. 7, and FIG. 8 are based on the block diagram shown in FIG. 1.

Figure 2:
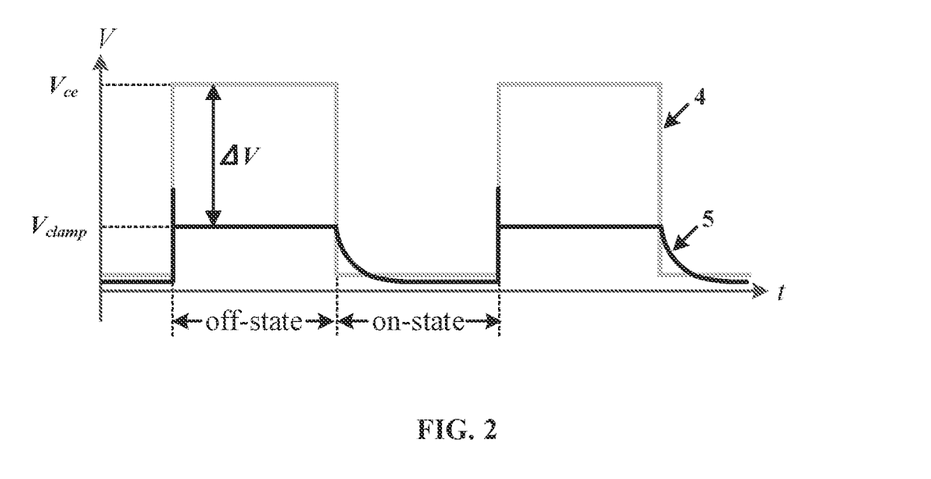
FIG. 2 shows waveforms of the input and output voltages of the on-line monitoring system.

FIG. 2 shows the waveforms of the input and output voltages of the on-line monitoring system. In FIG. 2, the waveform 4 is the input of the on-line monitoring system and the waveform 5 is the output of the on-line monitoring system. When the DUT 1 is off, the input is the high voltage Vce, while the voltage clamping circuit 3 clamps the output voltage to the low voltage Vclamp. Then the difference voltage ΔV between the input and the output of the on-line monitoring system is withstood by the voltage withstanding circuit 2. When the DUT 1 is on, the stable voltages of the input and the output of the on-line monitoring system are equivalent. The state of the on-line monitoring system changes automatically based on the electrical characterization of the components in the system without any other control signals.

Figure 3:
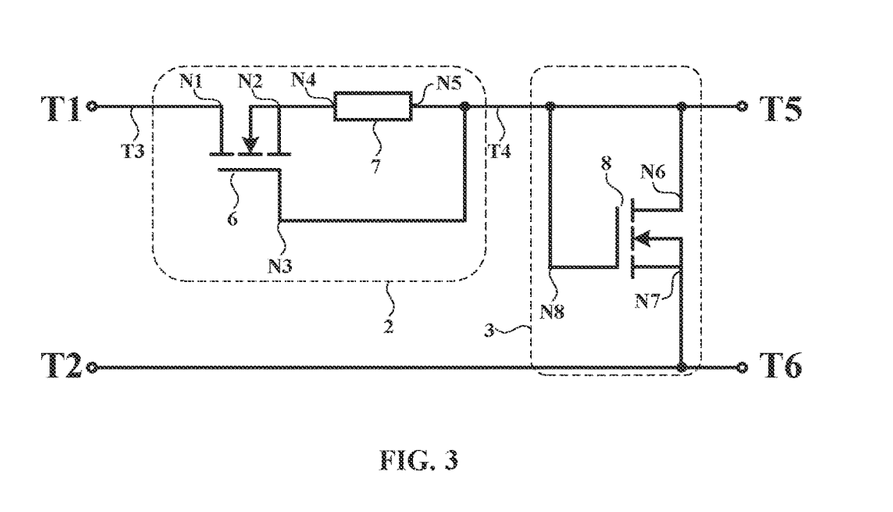
FIG. 3 shows a schematic of the on-line monitoring system shown in FIG. 1 according to a preferred embodiment of the disclosure.

FIG. 3 shows the schematic of the on-line monitoring system according to a preferred embodiment of the disclosure. In FIG. 3, the system comprises a FET 6, a resistor 7 and a FET 8, and the FET 6 and the resistor 7 form the voltage withstanding circuit 2 and the FET 8 forms the voltage clamping circuit 3. The drain N1 of the FET 6 is connected to the terminal T1. The source N2 of the FET 6 is connected to the node N4 of the resistor 7. The gate N3 of the FET 6 is connected to the other node N5 of the resistor 7. The drain N6 and the gate N8 of the FET 8 are connected to the terminal T4. The source N7 of the FET 8 is connected to the terminal T2.

When the DUT 1 is off, the input voltage Vin is high voltage, so the output voltage Vout is clamped to the gate threshold voltage of the FET 8 while the FET 6 is saturated. The gate threshold voltage of the FET 8 is slightly higher than the on-state voltage drop of the DUT 1. When the DUT 1 is on, the FET 6 is conductive while there is hardly any current through it. Therefore, the voltage drop on the FET 6 and the resistor 7 is nearly zero and the output voltage Vout is equal with the on-state voltage of the DUT 1.

In a preferred embodiment, the FET 6 is a depletion Metal-Oxide-Semiconductor field-effect transistor (DMOSFET), and the FET 8 is an enhancement Metal-Oxide-Semiconductor field-effect transistor (EMOSFET). The type of FETs could vary for different situations.

Figure 4:
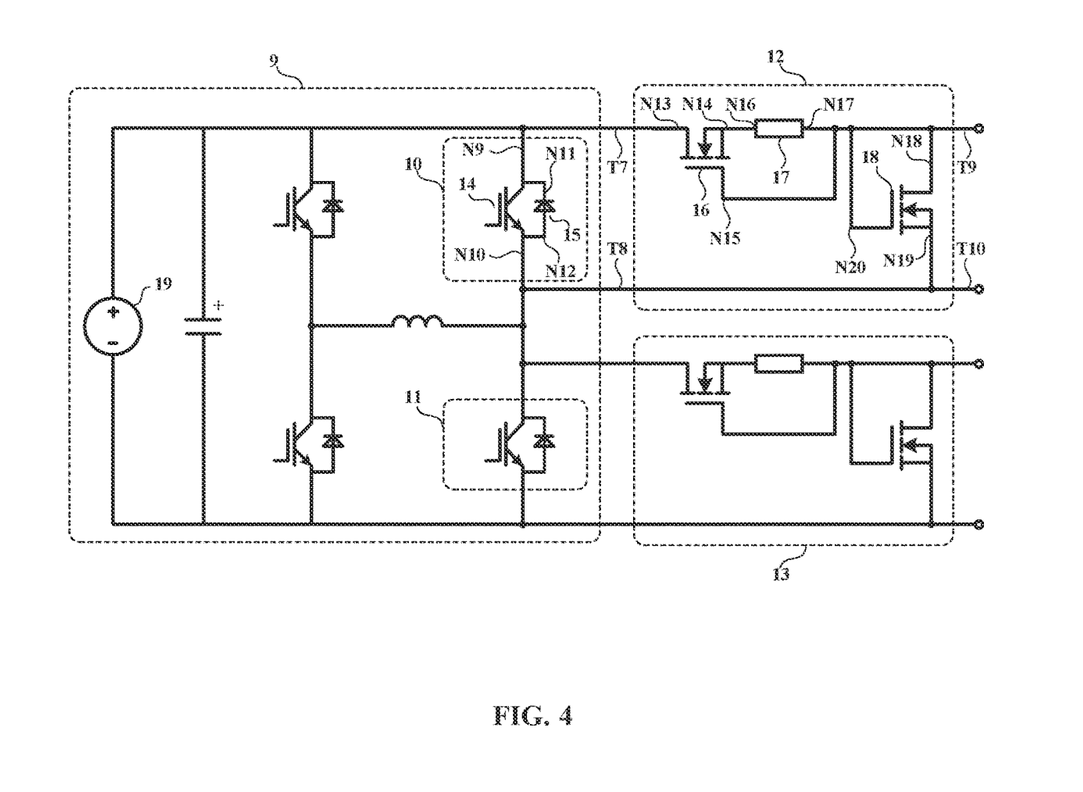
FIG. 4 shows a schematic of the on-line monitoring system shown in FIG. 1 used to monitor an arm of H-bridge circuit.

FIG. 4 shows the schematic of the on-line monitoring systems used to monitor an arm of H-bridge circuit according to an embodiment of the disclosure. In FIG. 4, two on-line monitoring systems 12 and 13 are used to monitoring the on-state voltage drops of two DUTs 10 and 11 within an H-bridge circuit 9. The DUT 10 comprises a transistor 14 and a diode 15.

Take the on-line monitoring system 12 for example. The input terminals of the on-line monitoring system 12 are the terminal T7 and the terminal T8, the terminal T7 is connected to the collector N9 of the transistor 14 and the cathode N11 of the diode 15, and the terminal T8 is connected to the emitter N10 of the transistor 14 and the anode N12 of the diode 15. The on-line monitoring system 12 comprises a FET 16, a resistor 17 and a FET 18. The drain N13 of the FET 16 is connected to the terminal T7. The source N14 of the FET 16 is connected to the node N16 of the resistor 17. The other node N17 of the resistor 17, the gate N15 of the FET 16, the gate N20 and the drain N18 of the FET 18 are connected together. The source N19 of the FET 18 is connected to the terminal T8. The output terminals are terminals T9 and T10, which are connected to the drain N18 and the source N19 of the FET 18. The connection method of the other on-line monitoring system 13 is totally similar.

When the DUT 10 is off, the input of the on-line monitoring system 12 is the voltage of the direct-current (DC) voltage source 19. At that state the FET 16 is saturated and withstands high voltage while the output voltage is equal to the gate threshold voltage of the FET 18. Besides, when the DUT 10 (14) is on, the FET 16 is conductive and there is nearly no voltage drop on the FET 16 and the resistor 17 while the output voltage is equal to the on-state voltage drop of the transistor 14 under test. The working principle of the other on-line monitoring system 13 is totally similar.

Figure 5:
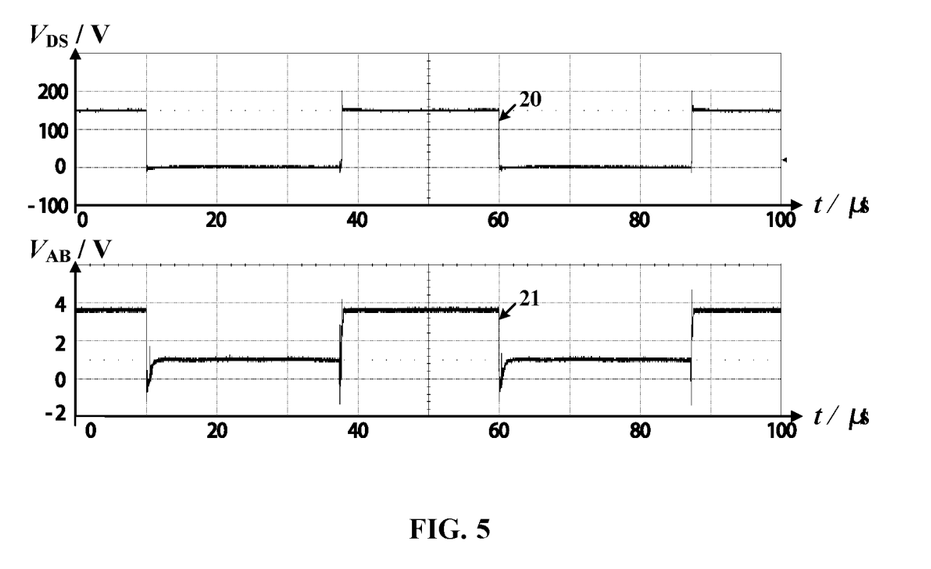
FIG. 5 shows experimental waveforms of the on-line monitoring system shown in FIG. 1 used to monitor the on-state voltage drop of a transistor.

FIG. 5 shows the experimental waveforms of monitoring the on-state voltage drop of a transistor, where the voltage of the DC voltage source 19 is 150V and the switching frequency of the DUTs 10 and 11 is 20 kHz. In FIG. 5, the waveform 20 and 21 show the voltage of the input and the output of the on-line monitoring 12 respectively. Waveform 21 shows that the on-line monitoring system 12 outputs about 4V voltage when the DUT 10 is off and about 1V voltage when the DUT 10 (14) is on, which verifies the operating principle disclosed above.

Figure 6:
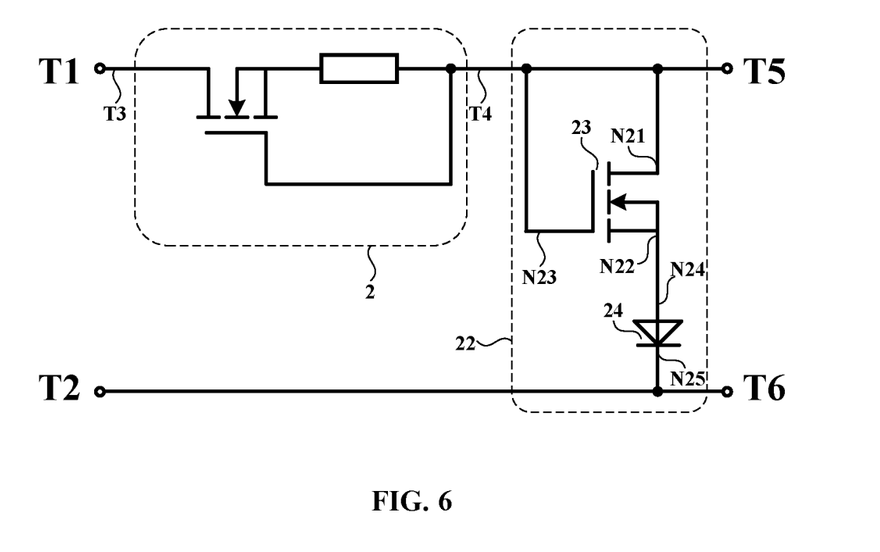
FIG. 6 shows a schematic of the on-line monitoring system shown in FIG. 1 including a diode according to a preferred embodiment of the disclosure.

FIG. 6 shows the schematic of the on-line monitoring system according to a preferred embodiment of the disclosure, comprising a voltage withstanding circuit 2 and a voltage clamping circuit 22. The structure of the voltage withstanding circuit 2 is the same with the one in FIG. 3. The voltage clamping circuit 22 comprises a FET 23 and a diode 24. The drain N21 and the gate N23 of the FET 23 are connected to the terminal T4. The source N22 of the FET 23 is connected to the anode N24 of the diode 24. The cathode N25 of the diode 24 is connected to the terminal T2 and the terminal T6.

Figure 7:
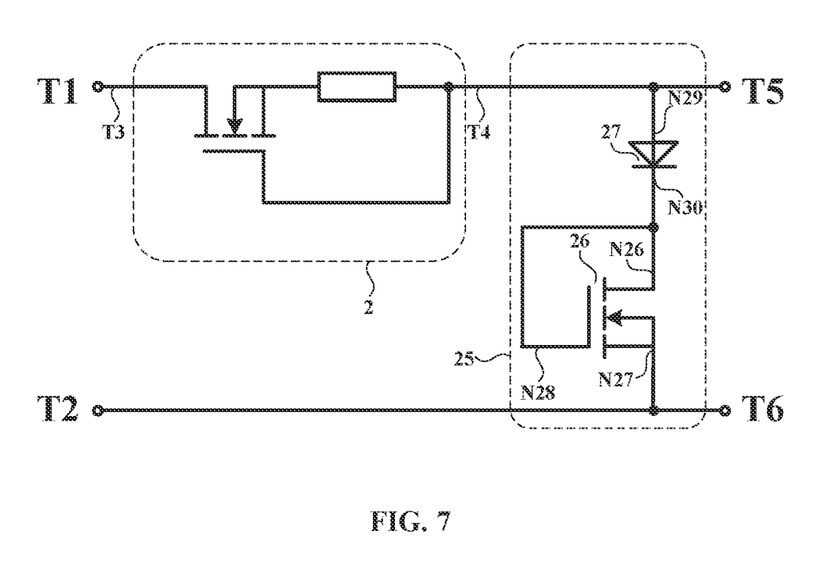
FIG. 7 shows a schematic of the on-line monitoring system shown in FIG. 1 including a diode according to another preferred embodiment of the disclosure.

FIG. 7 shows the schematic of the on-line monitoring system according to a preferred embodiment of the disclosure, comprising a voltage withstanding circuit 2 and a voltage clamping circuit 25. The structure of the voltage withstanding circuit 2 is the same with the one in FIG. 3. The voltage clamping circuit 25 comprises a FET 26 and a diode 27. The drain N26 and the gate N28 of the FET 26 are connected to the cathode N30 of the diode 27. The anode N29 of the diode 27 is connected to the terminal T4 and T5. The source N27 of the FET 26 is connected to the terminal T2 and T6.

Figure 8:
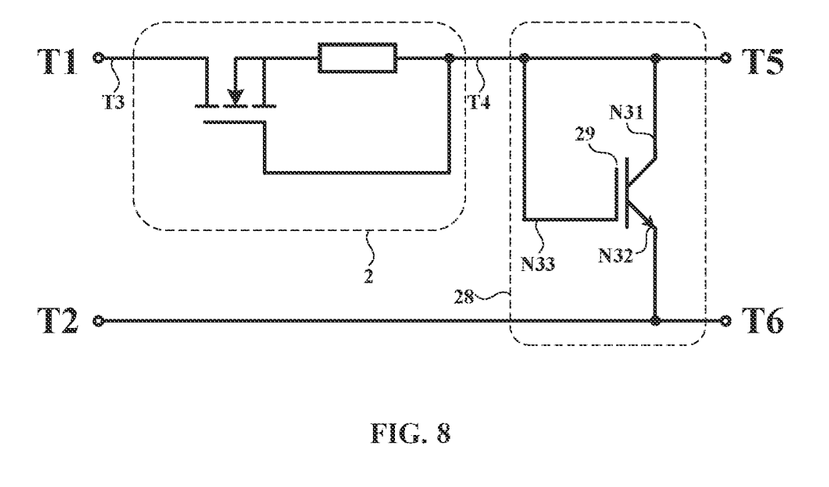
FIG. 8 shows a schematic the on-line monitoring system shown in FIG. 1 including a transistor according to another preferred embodiment of the disclosure.

FIG. 8 shows the schematic of the on-line monitoring system according to a preferred embodiment of the disclosure, comprising the voltage withstanding circuit 2 and the voltage clamping circuit 28. The structure of the voltage withstanding circuit 2 is the same with the one in FIG. 3. The voltage clamping circuit 28 comprises a transistor 29. The collector N31 and the gate N33 of the transistor 29 are connected to the terminal T4 and T5. The emitter N32 of the transistor 29 is connected to the terminal T2 and T6.

For the embodiments in FIG. 6-8, the DUT 1 could be controllable or uncontrollable power semiconductor devices or the combination of them. The combination of DUTs may be a MOSFET with an anti-paralleled diode or an IGBT with an anti-paralleled diode. For uncontrollable DUTs, the terminal T1 is connected to its cathode and the terminal T2 is connected to its anode. For DUT combination like MOSFET with antiparallel diode, the terminal T1 is connected to its drain and cathode, the terminal T2 is connected to its source and anode. For DUT combination like IGBT with antiparallel diode, the terminal T1 is connected to its collector and cathode, the terminal T2 is connected to its emitter and anode.

When the DUT 1 is controllable, the operating principle of the implementations in FIG. 6-8 is similar with the implementation in FIG. 3. If the DUT 1 includes an uncontrollable device like anti-paralleled diode, the on-line monitoring system outputs the opposite value of the on-state voltage drop of the diode when it is forward biased.

Figure 9:
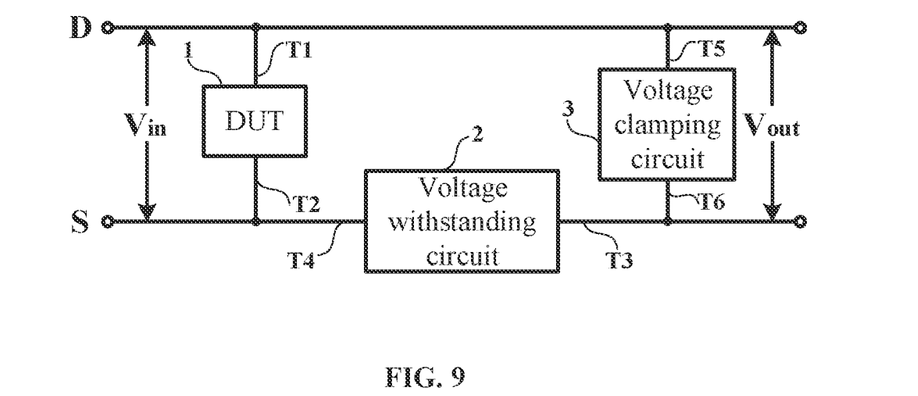
FIG. 9 shows an overall block diagram of an on-line monitoring system according to a second embodiment of the disclosure.

FIG. 9 shows an overall block diagram of the on-line monitoring system according to another embodiment of the disclosure. In FIG. 9, the on-line monitoring system comprises a voltage withstanding circuit 2 and a voltage clamping circuit 3. The two terminals of the DUT 1, terminal D T1 and terminal S T2, are the two input terminals of the on-line monitoring system. The terminal T3 and the terminal T4 are the two terminals of the voltage withstanding circuit 2. The terminal T5 and the terminal T6 are the two terminals of the voltage clamping circuit. The terminal T3 is connected to the terminal T6. The terminal T4 is connected to the terminal T2. The terminal T5 is connected to the terminal T1. The clamping voltage of the voltage clamping circuit 3 is higher than the on-state voltage drop of the DUT 1. The connection methods shown in FIG. 10-12 are based on the block diagram in FIG. 9.

Figure 10:
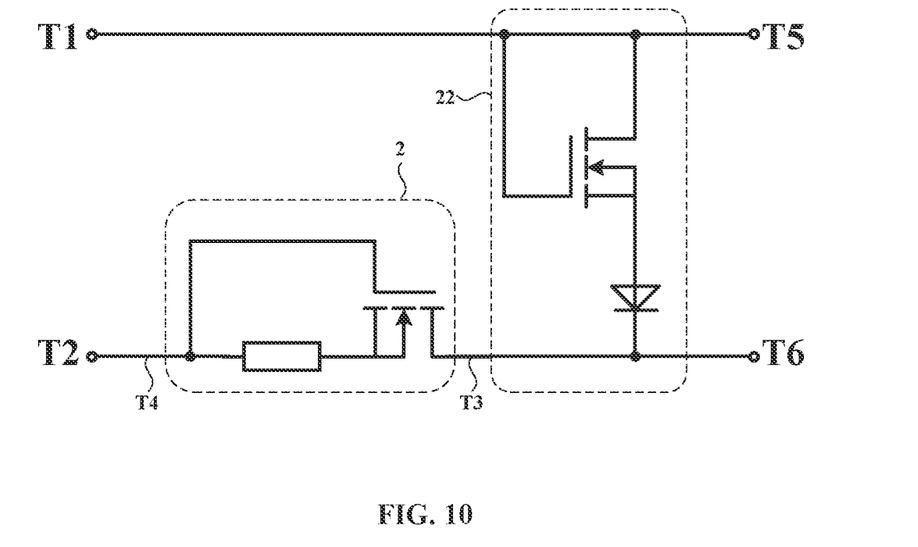
FIG. 10 shows a schematic of the on-line monitoring system shown in FIG. 9 according to a preferred embodiment of the disclosure.

FIG. 10 shows the schematic of the on-line monitoring system according to a preferred embodiment of the disclosure, comprising a voltage withstanding circuit 2 and a voltage clamping circuit 22. The structure of the voltage withstanding circuit 2 is the same with the one in FIG. 3. The structure and the connection method of the voltage clamping circuit 22 is the same with the one in FIG. 6. The terminal T1 is connected to the terminal T5. The terminal T3 is connected to the terminal T6. The terminal T2 is connected to the terminal T4.

Figure 11:
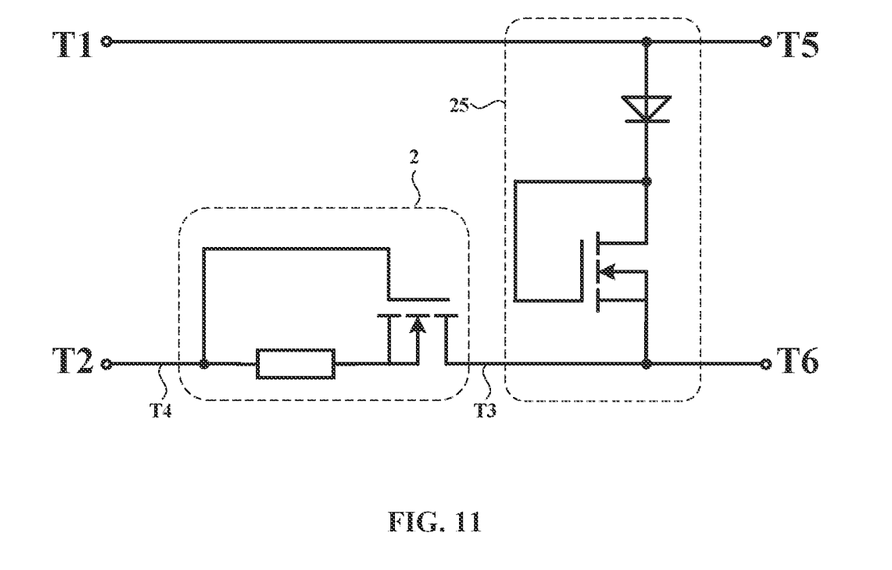
FIG. 11 shows a schematic of the on-line monitoring system shown in FIG. 9 according to a preferred embodiment of the disclosure.

FIG. 11 shows the schematic of the on-line monitoring system according to a preferred embodiment of the disclosure, comprising a voltage withstanding circuit 2 and a voltage clamping circuit 25. The structure of the voltage withstanding circuit 2 is the same with the one in FIG. 3. The structure of the voltage clamping circuit 25 is the same with the one in FIG. 7. The terminal T1 is connected to the terminal T5. The terminal T3 is connected to the terminal T6. The terminal T2 is connected to the terminal T4.

Figure 12:
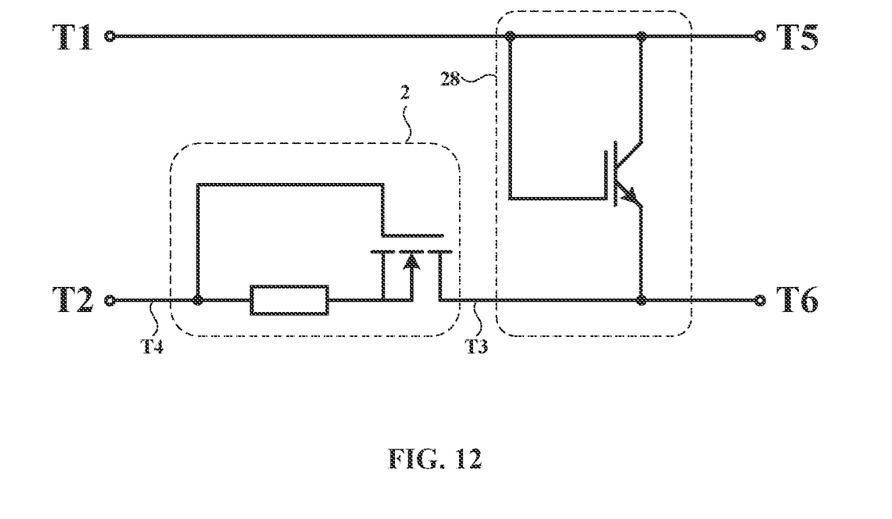
FIG. 12 shows a schematic of the on-line monitoring system shown in FIG. 9 according to a preferred embodiment of the disclosure.

FIG. 12 shows the schematic of the on-line monitoring system according to a preferred embodiment of the disclosure, comprising a voltage withstanding circuit 2 and a voltage clamping circuit 28. The structure of the voltage withstanding circuit 2 is the same with the one in FIG. 3. The structure of the voltage clamping circuit 28 is the same with the one in FIG. 8. The terminal T1 is connected to the terminal T5. The terminal T3 is connected to the terminal T6. The terminal T2 is connected to the terminal T4.

For the embodiments in FIG. 10-12, the DUT 1 could be controllable or uncontrollable power semiconductor devices or the combination of them. The combination of DUTs may be a MOSFET with an anti-paralleled diode or an IGBT with an anti-paralleled diode. For uncontrollable DUTs, the terminal T1 is connected to its cathode and the terminal T2 is connected to its anode. For DUT combination like MOSFET with anti-paralleled diode, the terminal T1 is connected to its drain and cathode, the terminal T2 is connected to its source and anode. For DUT combination like IGBT with anti-paralleled diode, the terminal T1 is connected to its collector and cathode, the terminal T2 is connected to its emitter and anode.

When the DUT 1 is controllable, the operating principle of the implementations in FIG. 10-12 is similar with the implementation in FIG. 3. If the DUT 1 includes an uncontrollable device like anti-paralleled diode, the on-line monitoring system outputs the opposite value of the on-state voltage drop of the diode when it is forward biased.

Figure 13:
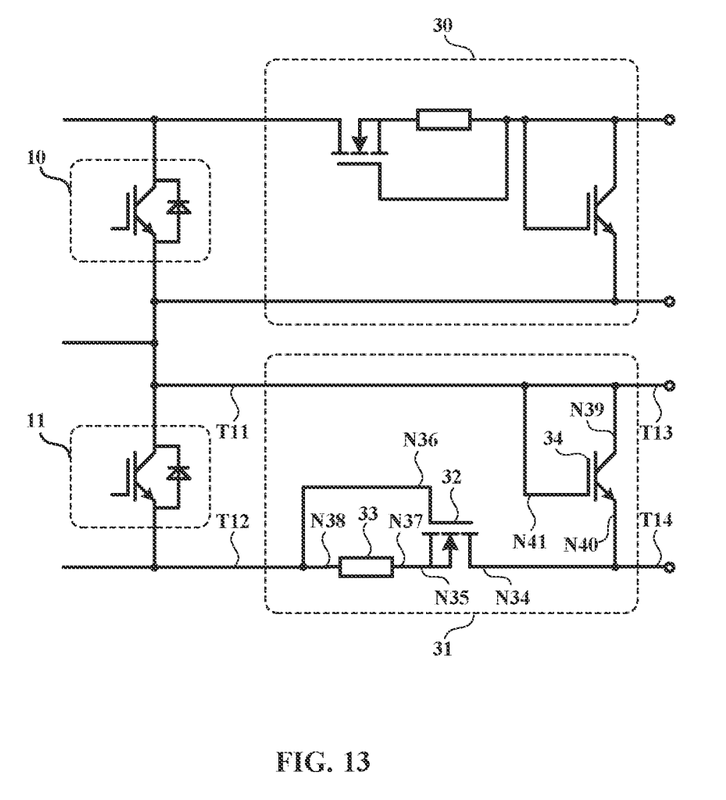
FIG. 13 shows a schematic of the on-line monitoring system shown in FIG. 9 used to monitor a half bridge circuit.

FIG. 13 shows the schematic of the on-line monitoring systems used to monitor a half bridge circuit according to an embodiment of the disclosure. In FIG. 13, two on-line monitoring systems 30 and 31 are used to monitoring the on-state voltage drops of two DUTs 10 and 11. The connection of DUTs 10 and 11 are the same as them in FIG. 4.

The configuration and operating principle of the on-line monitoring system 30 are the same as the on-line monitoring system 12. As for the on-line monitoring system 31, the input terminals are the terminal T11 and the terminal T12 and the output terminals are the terminal T13 and the terminal T14. The on-line monitoring system 31 comprises a FET 32, a resistor 33 and a transistor 34. The drain N34 of the FET 32 is connected to the terminal T14. The source N35 of the FET 32 is connected to the node N37 of the resistor 33. The other node N38 of the resistor 33 and the gate N36 of the FET 32 are connected to the terminal T12. The gate N41 and the collector N39 of the transistor 34 are connected to the terminal T13. The emitter N40 of the transistor 34 is connected to terminal T14.

When the DUT 11 is off, the input of the on-line monitoring system 31 is high voltage. At that state the FET 32 is saturated and withstands high voltage while the output voltage is equal to the gate threshold voltage of the transistor 34. Besides, when the DUT 11 is on, the FET 32 is conductive and there is nearly no voltage drop on the FET 32 and the resistor 33 while the output voltage is equal to the on-state voltage drop of the DUT 11.

Figure 14:
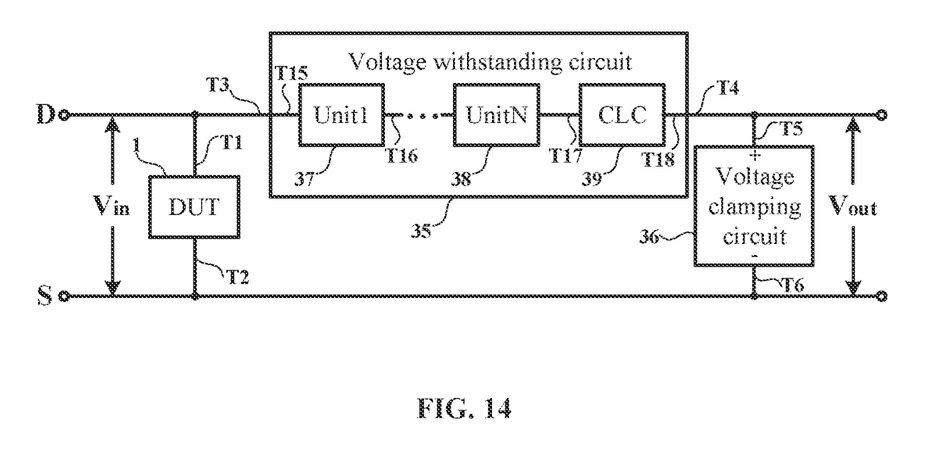
FIG. 14 shows an overall block diagram of an on-line monitoring system according to a third embodiment of the disclosure.
Figure 15:
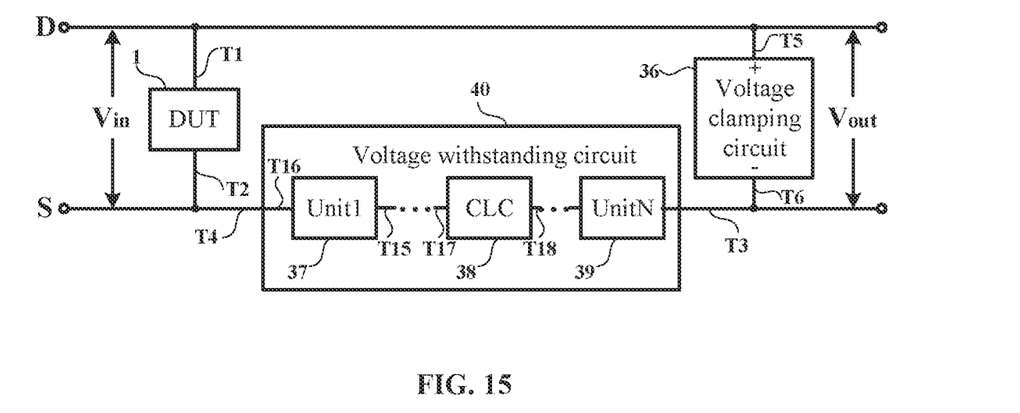
FIG. 15 shows an overall block diagram of the on-line monitoring system shown in FIG. 14 according to an embodiment of the disclosure.

FIG. 14 and FIG. 15 are the overall block diagrams of the on-line monitoring system according to another embodiment of the disclosure, in which the connections among the voltage withstanding circuit 35 or 40, the voltage clamping circuit 36 and the DUT 1 are similar with the embodiments in FIG. 1 and FIG. 9 respectively. The difference is the voltage withstanding circuits 35 and 40 are improved which comprise several voltage withstanding units 37 and 38 and a current limiting circuit 39. The terminal T15 and the terminal T16 are the two terminals of the voltage withstanding unit 37. The terminal T17 and the terminal T18 are the two terminals of the current limiting circuit 39. The voltage withstanding circuits 35 and 40 are the series connection of the voltage withstanding units 37 and 38 and the current limiting circuit 39. The current limiting circuit 39 is connected between the voltage withstanding unit 38 and the voltage clamping circuit 36 as shown in FIG. 14, or between the two voltage withstanding units as shown in FIG. 15.

Figure 16:
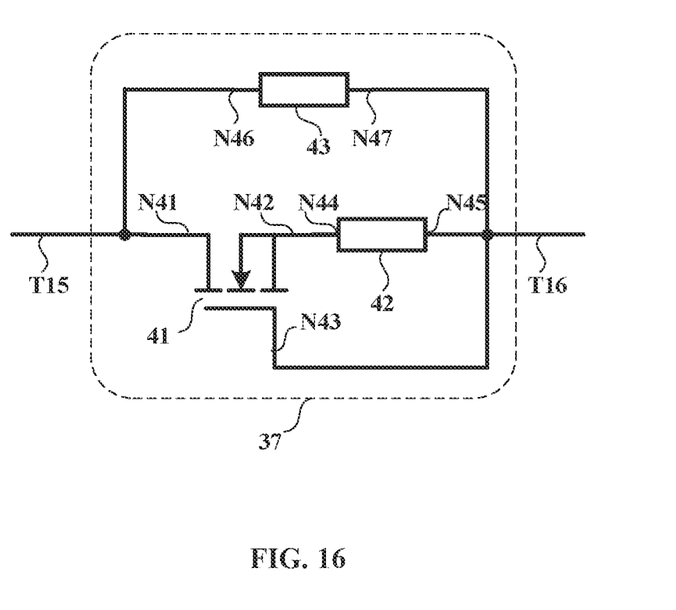
FIG. 16 shows a schematic of a voltage withstanding unit according to an embodiment of the disclosure.

FIG. 16 shows the schematic the voltage withstanding unit. In FIG. 16, the voltage withstanding unit 37 comprises a FET 41, a resistor 42 and a balancing resistor 43. The terminal T15 and the terminal T16 are the two terminals of the voltage withstanding unit 37. The drain N41 of the FET 41 is connected to the terminal T15. The source N42 of the FET 41 is connected to the node N44 of the resistor 42. The other node N45 of the resistor 42 is connected to the gate N43 of the FET 41. The gate N43 of the FET 41 is connected to the terminal T16. The two nodes N46 and N47 of the balancing resistor 43 are connected to the drain N41 and the gate N43 of the FET 41.

Figure 17:
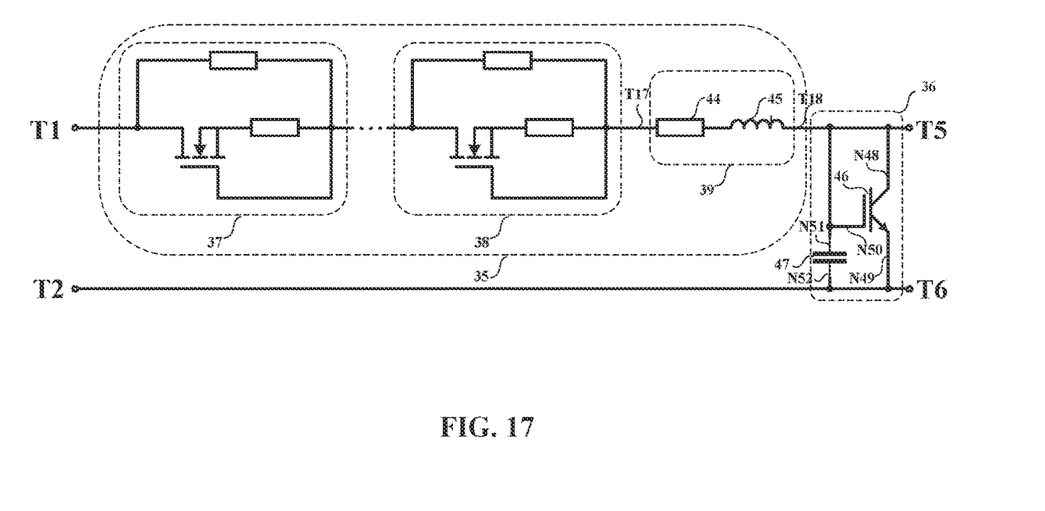
FIG. 17 shows a schematic of the on-line monitoring system including voltage withstanding units according to an embodiment of the disclosure.

FIG. 17 shows the schematic of the on-line monitoring system including voltage withstanding units according to an embodiment of the disclosure. In FIG. 17, the current limiting circuit 39 comprises a resistor 44 and an inductor 45, and the voltage clamping circuit 36 comprises a transistor 46 and a modulatory capacitor 47. The connection among the DUT 1, the voltage withstanding units 37 and 38, the current limiting circuit 39 and the voltage clamping circuit 36 is same as the block diagram showed in FIG. 14. Within the voltage clamping circuit 36, the connection of the transistor is similar with the implementation of the voltage clamping circuit 28, the collector N48 and the gate N50 of the transistor 46 are connected to the terminal T5, and the emitter N49 of the transistor 46 is connected to the terminal T6. The two nodes N51 and N52 of the modulatory capacitor 47 are connected to the gate N50 and the emitter N49 of the transistor 46.

Similar with the voltage clamping circuits 3, 22, and 25 shown in FIG. 3, FIG. 6 and FIG. 7, the transistor 46 in the voltage clamping circuit 36 could be substituted by a FET or a FET as well as a diode. When the voltage clamping circuit 36 comprises a FET, the two nodes N51 and N52 of the modulatory capacity 47 are connected to the gate and the source of the FET.

In FIG. 17, the operating principle of the on-line monitoring system is similar with that shown in FIG. 8. What's more, there are a few benefits of the embodiments in FIG. 17:

1. With the voltage withstanding units 37 and 38, the high voltage withstood by the voltage withstanding circuit 35 is equally distributed on the FETs 41 in the voltage withstanding units 37 and 38, which extremely reduces the voltage drop on the FETs 41 when the DUT 1 is off. Not only the safety of the on-line monitoring system is ensured but also the requirement for the voltage rating of the FETs 41 is much lower, which means lower cost of the on-line monitoring system.

2. With the current limiting circuit, the transient current in the on-line monitoring system when the DUT 1 is switched off or on is reduced, which protects the devices in the on-line monitoring system.

3. With the modulatory capacitor, the transient characterizations of the on-line monitoring system such as the settling time and the overshoot are adjustable, which means the on-line monitoring system could be appropriate for monitoring the DUT with a bigger scope of switching frequency.

The implementations of the on-line monitoring system disclosed above could clamp a high voltage input to a low voltage output based on the electrical characteristics of FETs and transistors, and could accurately measure the on-state voltage drop of the DUTs. The on-line monitoring system has a simple electrical structure and is appropriate to monitoring both controllable and uncontrollable power semiconductor devices. With the improved implementation, the on-line monitoring system is appropriate to DUTs with wider scope of voltage rating and switching frequency. In conclusion, this disclosure provides an on-line monitoring system for the on-state voltage drop of the power semiconductor devices which is simple, safe, low-cost, accurate and widely useful.

The specific embodiments of the disclosure are described above. It should be understood that the disclosure is not limited to the specific embodiments, and those skilled in the art can make various modifications or changes within the scope of the claims without influencing the substantive content of the disclosure.

We claim:

1. An on-line monitoring system for measuring an on-state voltage drop of a power semiconductor device, the monitoring system comprising:
 a voltage withstanding circuit and a voltage clamping circuit;
 wherein one terminal of the voltage withstanding circuit is connected to one terminal of the voltage clamping circuit, and the other terminal of the voltage withstanding circuit and the other terminal of the voltage clamping circuit are randomly connected to two terminals of the power semiconductor device under test respectively;

the two terminals of the voltage clamping circuit are output terminals of the on-line monitoring system;

a clamping voltage of the voltage clamping circuit is higher than the on-state voltage drop of the power semiconductor device under test;

when the power semiconductor device under test is off, an output voltage of the system is fixed to the clamping voltage, and when the power semiconductor device under test is on, the output voltage is not clamped; and the two terminals of the power semiconductor device under test are terminal D and terminal S, one terminal of the voltage withstanding circuit is connected to the terminal D, the other terminal of the voltage withstanding circuit is connected to one terminal of the voltage clamping circuit, the other terminal of the voltage clamping circuit is connected to the terminal S, and the two terminals of the voltage clamping circuit are the output terminals of the on-line monitoring system.

2. The on-line monitoring system according to claim 1, wherein the voltage withstanding circuit comprises a first field-effect transistor (FET) and a resistor, a drain of the first FET is connected to the terminal D, and two nodes of the resistor are connected to a gate and a source of the first FET respectively.

3. The on-line monitoring system according to claim 2, wherein the voltage clamping circuit comprises a second FET, a gate and a drain of the second FET are connected to the gate of the first FET, a source of the second FET is connected to the terminal S, and the drain and the source of the second FET are the output terminals of the on-line monitoring system.

4. The on-line monitoring system according to claim 3, wherein the voltage clamping circuit further comprises a diode, an anode of the diode is connected to the source of the second FET, a cathode of the diode is connected to the terminal S, and the drain of the second FET and the cathode of the diode are the output terminals of the on-line monitoring system.

5. The on-line monitoring system according to claim 3, wherein the voltage clamping circuit further comprises a diode, an anode of the diode is connected to the gate of the first FET, a cathode of the diode is connected to the drain and the gate of the second FET, the source of the second FET is connected to the terminal S, and the anode of the diode and the source of the second FET are the output terminals of the on-line monitoring system.

6. The monitoring system according to claim 2, wherein the voltage clamping circuit comprises a transistor, a gate and a collector of the transistor are connected to the gate of the first FET, an emitter of the transistor is connected to the terminal S, and the collector and the emitter of the transistor are the output terminals of the on-line monitoring system.

7. The on-line monitoring system according to claim 1, wherein the voltage withstanding circuit comprises one or more voltage withstanding units and a current limiting circuit, and the current limiting circuit is connected in series between any two voltage withstanding units or between the voltage withstanding unit and the voltage clamping circuit.

8. The on-line monitoring system according to claim 7, wherein the voltage withstanding unit comprises a first FET and a resistor, a drain of the first FET is one terminal of the voltage withstanding unit, a source of the first FET is connected to one node of the resistor, and a gate of the first FET connected to the other node of the resistor is the other terminal of the voltage withstanding unit.

9. The on-line monitoring system according to claim 8, wherein the voltage withstanding unit further comprises a voltage balancing resistor, and two nodes of the voltage balancing resistor are connected to the drain and the gate of the first FET respectively.

10. The on-line monitoring system according to claim 7, wherein the current limiting circuit comprises resistors or inductors or a series connection of resistors and inductors.

11. The on-line monitoring system for measuring an on-state voltage drop of a power semiconductor device, the monitoring system comprising:

a voltage withstanding circuit and a voltage clamping circuit;

wherein one terminal of the voltage withstanding circuit is connected to one terminal of the voltage clamping circuit, and the other terminal of the voltage withstanding circuit and the other terminal of the voltage clamping circuit are randomly connected to two terminals of the power semiconductor device under test respectively;

the two terminals of the voltage clamping circuit are output terminals of the on-line monitoring system;

a clamping voltage of the voltage clamping circuit is higher than the on-state voltage drop of the power semiconductor device under test;

when the power semiconductor device under test is off, an output voltage of the system is fixed to the clamping voltage, and when the power semiconductor device under test is on, the output voltage is not clamped; and wherein the two terminals of the power semiconductor device under test are terminal D and terminal S, one terminal of the voltage withstanding circuit is connected to the terminal S, the other terminal of the voltage withstanding circuit is connected to one terminal of the voltage clamping circuit, the other terminal of the voltage clamping circuit is connected to the terminal D, and the two terminals of the voltage clamping circuit are the output terminals of the on-line monitoring system.

12. The on-line monitoring system according to claim 11, wherein the voltage withstanding circuit comprises a first FET and a resistor, a source of the first FET is connected to the terminal S, two nodes of the resistor are connected to a gate and the source of the first FET respectively, and a drain of the first FET is connected to one terminal of the voltage clamping circuit.

13. The on-line monitoring system according to claim 12, wherein the voltage clamping circuit comprises a second FET and a diode, a cathode of the diode is connected to the drain of the first FET, an anode of the diode is connected to a source of the second FET, a gate and a drain of the second FET are connected to the terminal D, and the drain of the second FET and the cathode of the diode are the output terminals of the on-line monitoring system.

14. The on-line monitoring system according to claim 12, wherein the voltage clamping circuit comprises a second FET and a diode, a cathode of the diode is connected to a drain and a gate of the second FET, an anode of the diode is connected to the terminal D, the drain of the first FET is connected to a source of the second FET, and the anode of the diode and the source of the second FET are the output terminals of the on-line monitoring system.

15. The on-line monitoring system according to claim 12, wherein the voltage clamping circuit comprises a transistor, an emitter of the transistor is connected to the drain of the first FET, a gate and a collector of the transistor are connected to the terminal D, and the collector and the emitter of the transistor are the output terminals of the on-line monitoring system.

16. An on-line monitoring system for measuring an on-state voltage drop of a power semiconductor device, the monitoring system comprising:
a voltage withstanding circuit and a voltage clamping circuit;
wherein one terminal of the voltage withstanding circuit is connected to one terminal of the voltage clamping circuit, and the other terminal of the voltage withstanding circuit and the other terminal of the voltage clamping circuit are randomly connected to two terminals of the power semiconductor device under test respectively;
the two terminals of the voltage clamping circuit are output terminals of the on-line monitoring system;
a clamping voltage of the voltage clamping circuit is higher than the on-state voltage drop of the power semiconductor device under test;
when the power semiconductor device under test is off, an output voltage of the system is fixed to the clamping voltage, and when the power semiconductor device under test is on, the output voltage is not clamped;
the voltage withstanding circuit comprises one or more voltage withstanding units and a current limiting circuit, and the current limiting circuit is connected in series between any two voltage withstanding units or between the voltage withstanding unit and the voltage clamping circuit; and
the voltage clamping circuit comprises a second FET or a transistor, a gate and a drain of the second FET connected together is a positive terminal of the voltage clamping circuit, and a source of the second FET is a negative terminal of the voltage clamping circuit; or a gate and a collector of the transistor connected together is the positive terminal of the voltage clamping circuit, and an emitter of the transistor is the negative terminal of the voltage clamping circuit.

17. The on-line monitoring system according to claim 16, wherein the voltage clamping circuit further comprises a diode, a cathode of the diode is connected to the gate and the drain of the second FET, and an anode of the diode is the positive terminal of the voltage clamping circuit; or the anode of the diode is connected to the source of the second FET, and the cathode of diode is the negative terminal of the voltage clamping circuit.

18. The on-line monitoring system according to claim 16, wherein the voltage clamping circuit further comprises a modulatory capacitor, two nodes of the modulatory capacitor are respectively connected to the gate and the source of the second FET, or to the gate and the emitter of the transistor.

\* \* \* \* \*